United States Patent
Yun et al.

(10) Patent No.: US 7,761,757 B2
(45) Date of Patent: Jul. 20, 2010

(54) APPARATUS AND METHOD OF SETTING TEST MODE IN SEMICONDUCTOR INTEGRATED CIRCUIT

(75) Inventors: Won-Joo Yun, Ichon (KR); Hyun-Woo Lee, Ichon (KR); Dong-Suk Shin, Ichon (KR)

(73) Assignee: Hynix Semiconductor Inc. (KR)

( * ) Notice: Subject to any disclaimer, the term of this patent is extended or adjusted under 35 U.S.C. 154(b) by 362 days.

(21) Appl. No.: 12/013,866

(22) Filed: Jan. 14, 2008

(65) Prior Publication Data
US 2009/0003101 A1 Jan. 1, 2009

(30) Foreign Application Priority Data
Jun. 26, 2007 (KR) .................... 10-2007-0063070

(51) Int. Cl.
*G01R 31/28* (2006.01)
(52) U.S. Cl. .................... 714/724; 714/25; 714/27; 714/732; 365/226; 365/189.09; 365/194; 307/113; 307/125; 307/130; 307/143
(58) Field of Classification Search ........................ None
See application file for complete search history.

(56) References Cited

U.S. PATENT DOCUMENTS

| | | | |
|---|---|---|---|
| 5,039,875 A | 8/1991 | Chang | |
| 6,690,220 B2 | 2/2004 | Kuboshima et al. | |
| 6,914,461 B2 | 7/2005 | Kwon | |
| 7,019,417 B2 * | 3/2006 | Kang | 307/113 |
| 2002/0110031 A1 * | 8/2002 | Lee et al. | 365/201 |
| 2002/0186603 A1 * | 12/2002 | Kyung | 365/201 |
| 2004/0071139 A1 | 4/2004 | Burnett | |
| 2005/0190627 A1 * | 9/2005 | Nakatake et al. | 365/226 |
| 2005/0212555 A1 * | 9/2005 | Ohno | 326/38 |
| 2006/0239100 A1 * | 10/2006 | Park | 365/225.7 |
| 2007/0079052 A1 * | 4/2007 | Hasegawa et al. | 711/100 |
| 2008/0091378 A1 * | 4/2008 | Jeong et al. | 702/130 |

FOREIGN PATENT DOCUMENTS

| | | |
|---|---|---|
| JP | 10-149676 | 6/1998 |
| JP | 2002-084176 | 3/2002 |
| KR | 1020050052850 A | 6/2005 |
| KR | 1020060073114 A | 6/2006 |

* cited by examiner

*Primary Examiner*—John P Trimmings
(74) *Attorney, Agent, or Firm*—Baker & McKenzie LLP

(57) ABSTRACT

An apparatus for setting a test mode in a semiconductor integrated circuit includes a test mode control block that generates a coding control signal according to whether or not a control fuse is cut, and a test mode coding block that sets default values of a multi-bit test code in response to the coding control signal.

15 Claims, 5 Drawing Sheets

US 7,761,757 B2

APPARATUS AND METHOD OF SETTING TEST MODE IN SEMICONDUCTOR INTEGRATED CIRCUIT

CROSS-REFERENCES TO RELATED APPLICATION

The present application claims priority under 35 U.S.C. 119(a) to Korean Patent Application number 10-2007-0063070, filed on Jun. 26, 2007, in the Korean Intellectual Property Office, the contents of which are incorporated herein by reference in their entirety as if set forth in full.

BACKGROUND

1. Technical Field

The embodiments described herein relate to semiconductor integrated circuits, and in particular, to an apparatus and method of setting a test mode in a semiconductor integrated circuit that improves adaptability to various environments.

2. Related Art

Generally, a test is needed at some point during production of a conventional semiconductor integrated circuit, since the simulation results obtained during design and the actual chip operation will often be different. In fact, a large number of tests are performed in order to reduce the error rate of the final semiconductor integrated circuits.

The tests are performed by coding a multi-bit test signal set in an MRS (Mode Register Set) circuit. To this end, the semiconductor integrated circuit includes a test mode setting apparatus that codes a multi-bit test signal to generate a multi-bit test code. The test mode setting apparatus includes a plurality of fuse circuits. Then, the plurality of fuse circuits are artificially controlled to set the default values of the multi-bit test code. Semiconductor integrated circuits having various functions and structures require different default values of the test code. Further, as occasion demands, the test code may not be used at all.

In a conventional apparatus for setting a test mode in a semiconductor integrated circuit, one default value is fixed by a fuse circuit. In order to meet the demands of various semiconductor integrated circuits, the individual semiconductor integrated circuits need to have a test mode setting apparatus having a corresponding configuration. But due to the fixed nature of the fuse circuits, conventional test mode setting apparatus have poor adaptability to various semiconductor integrated circuits. Therefore, time and costs for developing and producing the semiconductor integrated circuit are increased.

SUMMARY

An apparatus and method of setting a test mode in a semiconductor integrated circuit that improves adaptability to various environments is described herein. An apparatus and method of setting a test mode in a semiconductor integrated circuit that reduces time and costs is also described herein.

According to one aspect, an apparatus for setting a test mode in a semiconductor integrated circuit includes a test mode control block that generates a coding control signal according to whether or not a control fuse is cut, and a test mode coding block that sets default values of a multi-bit test code in response to the coding control signal.

According to another aspect, a method of setting a test mode in a semiconductor integrated circuit includes detecting whether or not a control fuse is cut and generating a coding control signal, if the coding control signal is enabled, setting default values of a multi-bit test code to a first level, and if the coding control signal is disabled, setting the default values of the multi-bit test code according to whether or not a plurality of coding fuses are cut.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
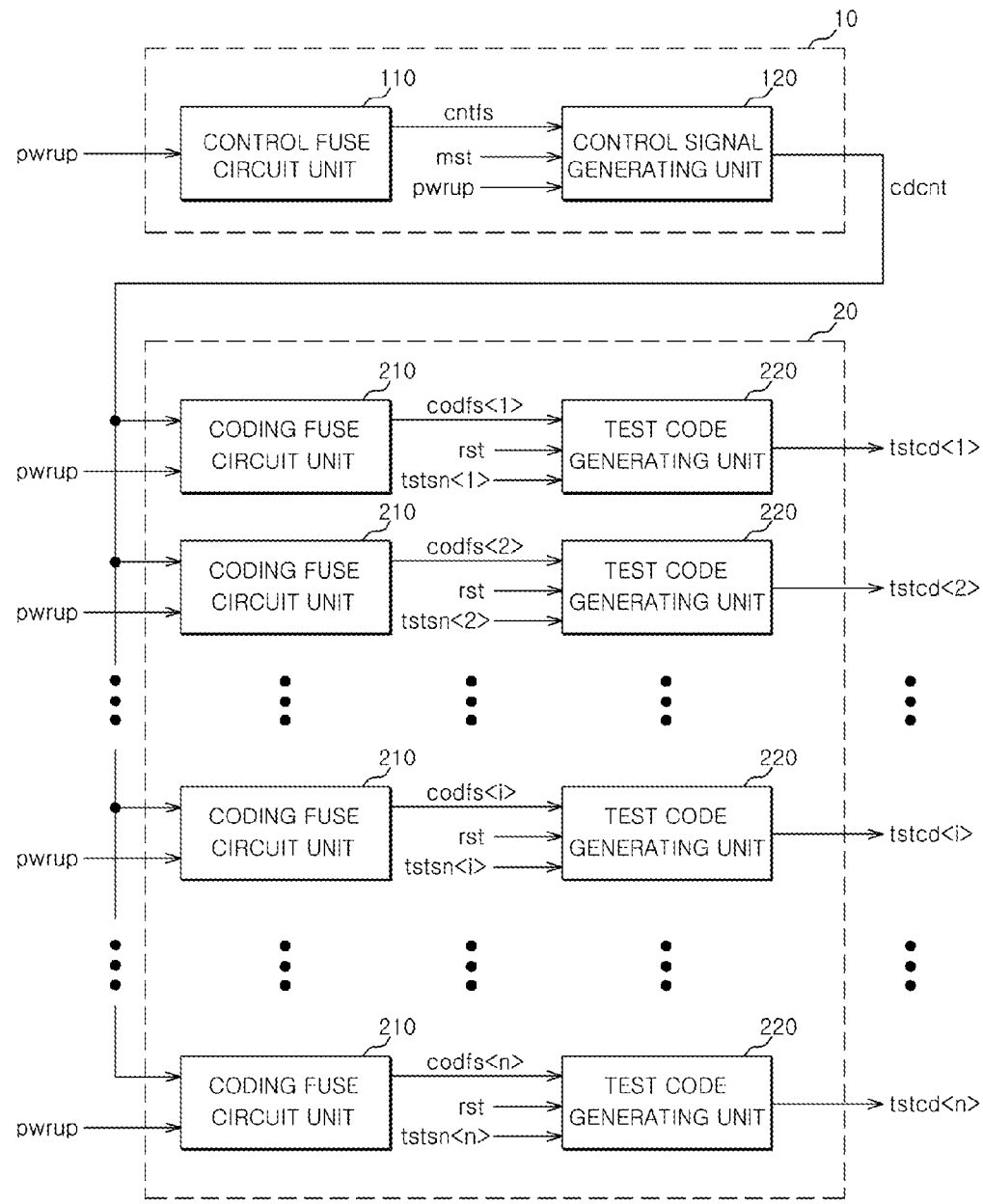
FIG. 1 is a block diagram showing the configuration of an example apparatus for setting a test mode in a semiconductor integrated circuit according to one embodiment.

FIG. 1 is a diagram illustrating an example apparatus 11 for setting a test mode in accordance with one embodiment. Referring to FIG. 1, the apparatus 11 for setting a test mode (hereinafter, also referred to as "test mode setting apparatus 11") can include a test mode control block 10 and a test mode coding block 20.

The test mode control block 10 can be configured to generate a coding control signal 'cdcnt' according to whether or not a control fuse is cut and whether or not a mode setting signal 'mst' is enabled. More particularly, the test mode control block 10 can be configured to disable the coding control signal 'cdcnt' when the control fuse is not cut, and to enable the coding control signal 'cdcnt' when the control fuse is cut. Even when the coding control signal 'cdcnt' is enabled, if the mode setting signal 'mst', which can be input in a pulsed manner, is enabled, then the coding control signal 'cdcnt' is disabled again.

The test mode control block 10 can include a control fuse circuit unit 110 that can be configured to generate a control fuse signal 'cntfs' in response to a power-up signal 'pwrup' according to whether or not the control fuse is cut, and a control signal generating unit 120 that can be configured to generate the coding control signal 'cdcnt' in response to the control fuse signal 'cntfs', the mode setting signal 'mst', and the power-up signal 'pwrup'.

The test mode coding block 20 can be configured to set default values of an n-bit test code 'tstcd<1:n>' in response to the coding control signal 'cdcnt'. More particularly, the test mode coding block 20 can be configured to set the default values of the n-bit test code 'tstcd<1:n>' to a first level (for example a low level) when the coding control signal 'cdcnt' is enabled, and to set the default values of the n-bit test code 'tstcd<1:n>' according to whether or not n coding fuses are cut, when the coding control signal 'cdcnt' is disabled. Subsequently, the test mode coding block 20 can be configured to change the values of the n-bit test code 'tstcd<1:n>', which are set to the default values, in response to an n-bit test signal 'tstsn<1:n>'.

The test mode coding block 20 can include a coding fuse circuit unit 210 and a test code generating unit 220.

The coding fuse circuit unit 210 can be configured to generate a one-bit coding fuse signal 'codfs<i>' in response to the power-up signal 'pwrup' and the coding control signal 'cdcnt' according to whether or not the coding fuse is cut. The test code generating unit 220 can be configured to generate a one-bit test code 'tstcd<i>' in response to the coding fuse signal 'codfs<i>', a reset signal 'rst', and a one-bit test signal 'tstsn<i>'.

In the test mode coding block 20, (n) coding fuse circuit units 210 and (n) test code generating units 220 can be provided. Each of the coding fuse circuit units 210 can be configured to generate the coding fuse signal 'codfs<i>', and thus (n) coding fuse signals 'codfs<i>' can be generated. A one-bit test signal 'tstsn<i>' can be input to each of the test code generating units 220, and a one-bit test code 'tstcd<1:n>' can be output there from. That is, n-bit test signal 'tstsn<1:n>' can be input to the (n) test code generating units 220, and an n-bit test code 'tstcd<1: n>' can be output there from.

As such, in a test mode setting apparatus 11, whether or not the coding control signal 'cdcnt' is enabled can be determined according to whether or not the control fuse is cut. If the coding control signal 'cdcnt' is enabled, the test mode coding block 20 can be configured to set the default values of the n-bit test code 'tstcd<1: n>' regardless of whether or not the coding fuses are cut. Therefore, according to the demands of various semiconductor integrated circuits, the default values of the n-bit test code 'tstcd<1:n>' can be set according to whether or not the coding fuses are cut, or the default values may be set regardless of whether or not the coding fuses are set. As a result, the test mode setting apparatus can be mounted on various semiconductor integrated circuits.

Figure 2:
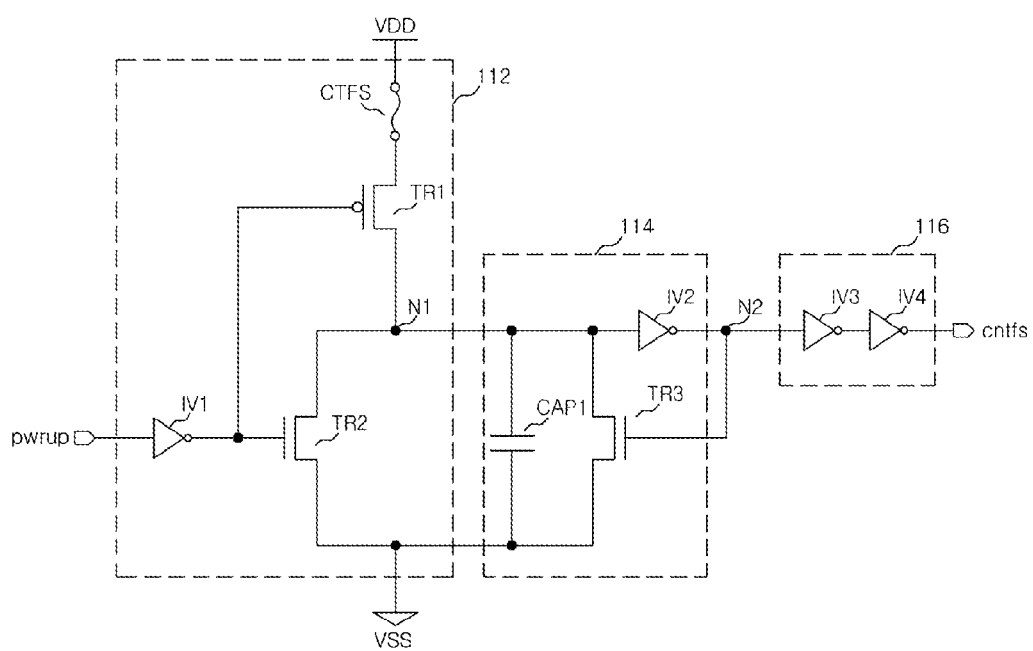
FIG. 2 is a diagram showing the detailed configuration of a control fuse circuit unit that can be included in the apparatus shown in FIG. 1.

FIG. 2 is a diagram showing the detailed configuration of the control fuse circuit 110 unit shown in FIG. 1. Referring to FIG. 2, the control fuse circuit unit 110 can include a first potential setter 112, a first potential controller 114, and a driver 116.

The first potential setter 112 can be configured to set a potential on a first node N1 in response to the power-up signal 'pwrup'. The first potential controller 114 can be configured to maintain and invert the voltage on the first node N1, and to transmit the inverted voltage to a second node N2. The driver 116 can be configured to generate the control fuse signal 'cntfs' using the second node N2 to.

The first potential setter 112 can include a first inverter IV1 that can be configured to receive the power-up signal 'pwrup', the control fuse CTFS that has a first terminal connected to a supply terminal of external power VDD, a first transistor TR1 that has a gate, to which an output signal of the first inverter IV1 can be input, a source connected to a second terminal of the control fuse CTFS, and a drain connected to the first node N1, and a second transistor TR2 that has a gate, to which the output signal of the first inverter IV1 can be input, a drain connected to the first node N1, and a source connected to a ground terminal.

The first potential controller 114 can include a first capacitor CAP1 connected between the first node N1 and the ground terminal, a third transistor TR3 that has a gate connected to the second node N2, a drain connected to the first node N1, and a source connected to the ground terminal, and a second inverter IV2 that can be configured to invert the voltage on the first node N1 and transmit the inverted voltage to the second node N2.

The driver 116 can include a third inverter IV3 and a fourth inverter IV4. The third inverter IV3 and the fourth inverter IV4 pass the voltage of the second node N2, to generate the control fuse signal 'cntfs'.

With this configuration, when the control fuse CTFS is not cut, and if the power-up signal 'pwrup' is enabled, then the control fuse circuit unit 110 can be configured to generate the control fuse signal 'cntfs' at a low level. Meanwhile, when the control fuse CTFS is cut, even if the power-up signal 'pwrup' is enabled, then the external power VDD is not supplied to the first node N1. Accordingly, the control fuse signal 'cntfs' is at a high level.

Figure 3:
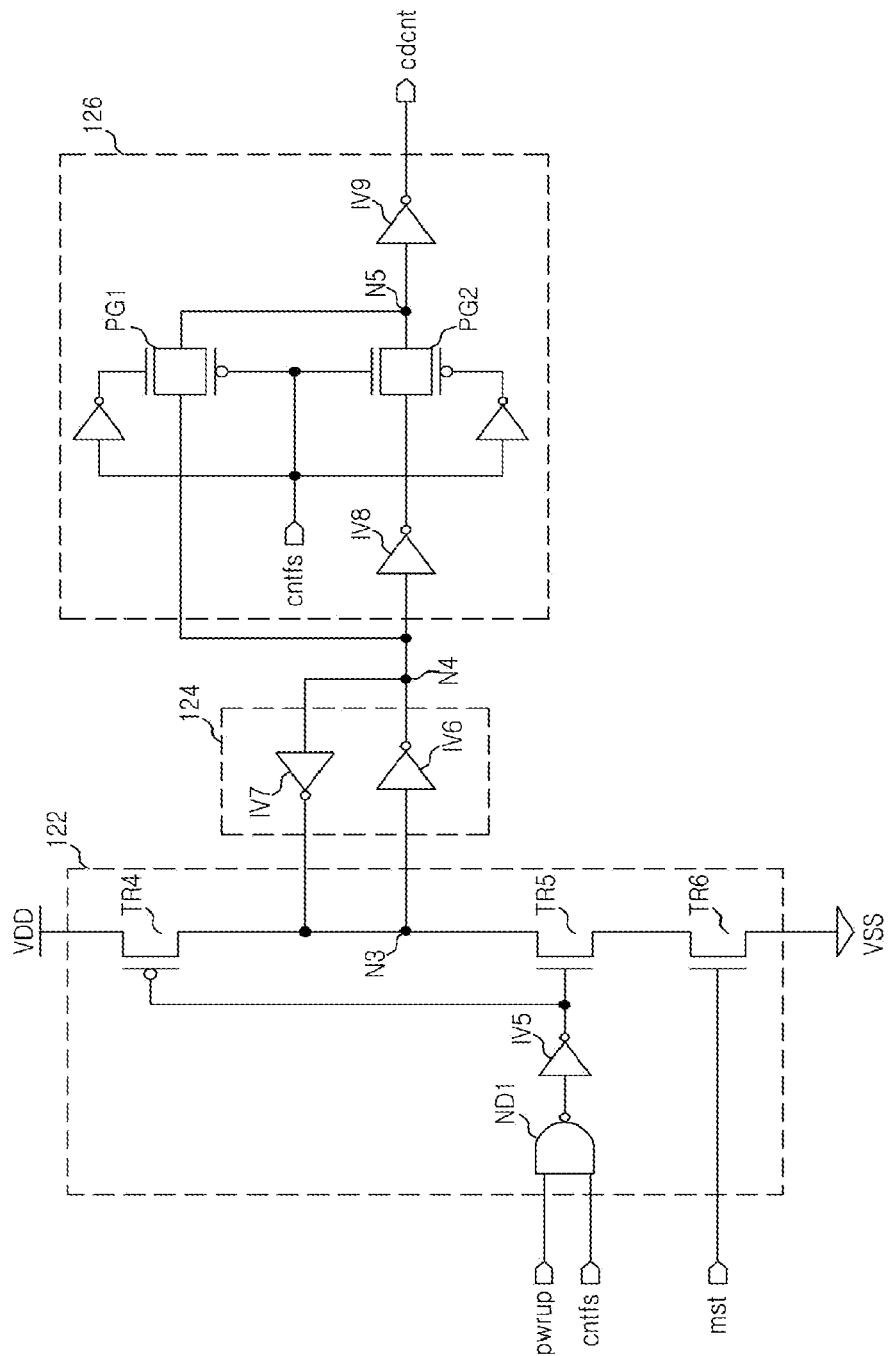
FIG. 3 is a diagram showing the detailed configuration of a control signal generating unit that can be included in the apparatus shown in FIG. 1.

FIG. 3 is a diagram showing the detailed configuration of the control signal generating unit 120 shown in FIG. 1. Referring to FIG. 3, the control signal generating unit 120 can include a second potential setter 122, a first latch 124, and a first switch 126. The second potential setter 122 can be configured to set a voltage level on a third node N3 in response to the power-up signal 'pwrup', the control fuse signal 'cntfs', and the mode setting signal 'mst'. The first latch 124 can be configured to latch and invert the voltage on the third node N3, and to transmit the latched and inverted voltage to a fourth node N4. The first switch 126 can be configured to control a path of the voltage on the fourth node N4 in response to the control fuse signal 'cntfs' to generate the coding control signal 'cdcnt'.

The second potential setter 122 can include a first NAND gate ND1 that can be configured to receive the power-up signal 'pwrup' and the control fuse signal 'cntfs', a fifth inverter IV5 that can be configured to receive an output signal of the first NAND gate ND1, a fourth transistor TR4 that can have a gate, to which an output signal of the fifth inverter IV5 is input, a source, to which the external power VDD is applied, and a drain connected to the third node N3, a fifth transistor TR5 that can have a gate, to which the output signal of the fifth inverter IV5 is input, and a drain connected to the third node N3, and a sixth transistor TR6 that can have a gate, to which the mode setting signal 'mst' is input, a drain connected to a source of the fifth transistor TR5, and a source connected to the ground terminal.

The first latch 124 can include a sixth inverter IV6 that can be configured to invert the voltage on the third node N3 and output the inverted voltage to the fourth node N4, and a seventh inverter IV7 that can be configured to invert the voltage on the fourth node N4 and output the inverted voltage to the third node N3.

The first switch 126 can include a first pass gate PG1 that can be configured to transmit the voltage on the fourth node N4 to a fifth node N5 in response to the control fuse signal 'cntfs', an eighth inverter IV8 that can be configured to receive the voltage on the fourth node N4, a second pass gate PG2 that can be configured to transmit an output signal of the eighth inverter IV8 to the fifth node N5 in response to the control fuse signal 'cntfs', and a ninth inverter IV9 that can be configured to receive the voltage on the fifth node N5 and output the coding control signal 'cdcnt'.

As described above, the potential of the control fuse signal 'cntfs' is at a low level when the control fuse CTFS is not cut. In this case, the fourth transistor TR4 is turned on, and the fifth transistor TR5 is turned off. Accordingly, the potential on the third node N3 is at a high level. Since the potential of the control fuse signal 'cntfs' is at the low level, the first pass gate PG1 is turned on, and the second pass gate PG2 is turned off. Therefore, the coding control signal 'cdcnt' is disabled at a high level.

Meanwhile, the potential of the control fuse signal 'cntfs' is at a high level when the control fuse CTFS is cut. At this time, if the power-up signal 'pwrup' is enabled, the fourth transistor TR4 is turned off, and the fifth transistor TR5 is turned on. However, in a state where the mode setting signal 'mst' is not enabled, the sixth transistor TR6 is maintained in a the turned off state, and thus the potential on the third node N3 is kept at the high level. Since the control fuse signal 'cntfs' is at the high level, the first pass gate PG1 is turned off, and the second pass gate PG2 is turned on. Accordingly, the coding control signal 'cdcnt' is enabled at a low level.

The default values of the (n) test codes 'tstcd<1:n>' that are generated by the test mode coding block 20 can be defined on the basis of the coding control signal 'cdcnt'. That is, if the coding control signal 'cdcnt' is enabled, the bits of the n-bit test code 'tstcd<1: n>' can have the default values, in the form of low-level potentials. Meanwhile, if the coding control signal 'cdcnt' is disabled, then the default values of the n-bit test code 'tstcd<1: n>' can be set according to whether or not the (n) coding fuses are cut. Even when the control fuse CTFS is cut, if the mode setting signal 'mst' is enabled, the sixth transistor TR6 is turned on. Accordingly, the voltage level on the third node N3 is changed to a low level, and the coding control signal 'cdcnt' is disabled at a high level. In this case, the test mode coding block 20 can be configured to use the n-bit test code 'tstcd<1:n>' having the default values according to the (n) coding fuses.

Figure 4:
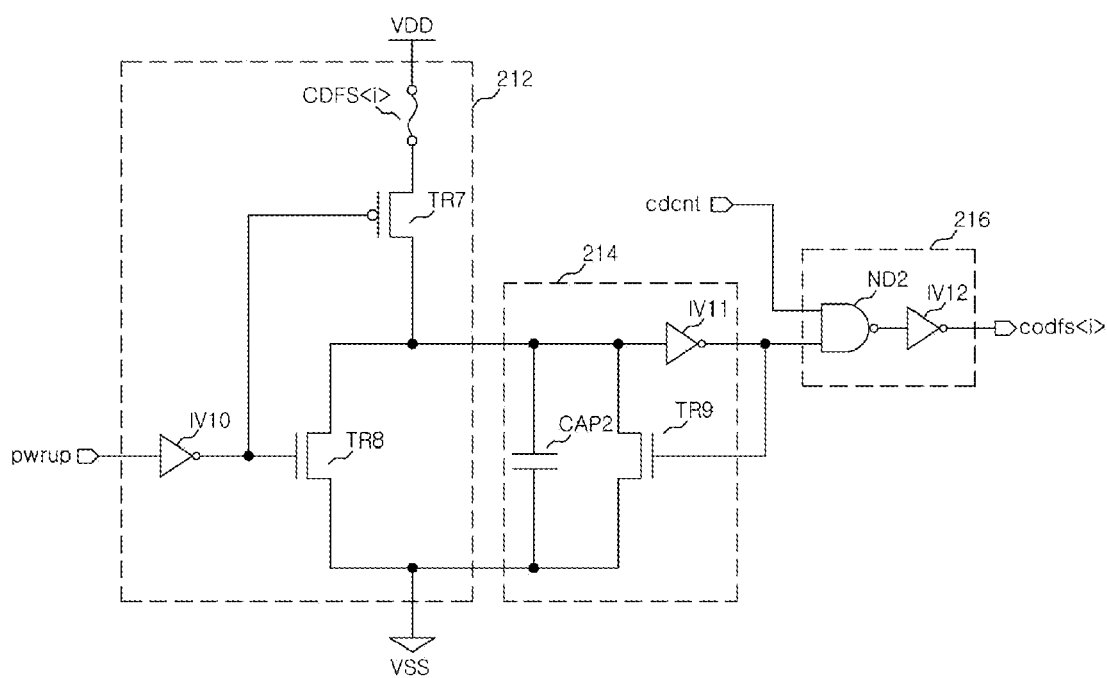
FIG. 4 is a diagram showing the detailed configuration of a coding fuse circuit unit that can be included in the apparatus shown in FIG. 1.

FIG. 4 is a diagram showing the detailed configuration of the coding fuse circuit 210 unit shown in FIG. 1. The coding fuse circuit unit 210 can include a third potential setter 212, a second potential controller 214, and a signal combiner 216.

The third potential setter 212 can have the same configuration as the first potential setter 112 of the control fuse circuit unit 110, and the second potential controller 214 can have the same configuration as the first potential controller 114 of the control fuse circuit unit 110. The coding fuse circuit unit 210 can be different from the control fuse circuit unit 110 in that the signal combiner 216 has a different configuration from the driver 116.

That is, similarly to the first potential setter 112, the third potential setter 212 can include a tenth inverter IV10, the coding fuse CDFS<i>, a seventh transistor TR7, and an eighth transistor TR8.

Similarly to the first potential controller 114, the second potential controller 214 can include a second capacitor CAP2, a ninth transistor TR9, and an eleventh inverter IV11.

The signal combiner 216 can include a second NAND gate ND2 that can be configured to receive an output signal of the second potential controller 214 and the coding control signal 'cdcnt', and a twelfth inverter IV12 that can be configured to receive an output signal of the second NAND gate ND2 and outputs the coding fuse signal 'codfs<i>'.

With this configuration, if the coding control signal 'cdcnt' is enabled, the coding fuse signal 'codfs<i>' is at a low level. In addition, if the coding control signal 'cdcnt' is disabled, the potential level of the coding fuse signal 'codfs<i>' is determined according to whether or not the coding fuse CDFS<i> is cut.

Figure 5:
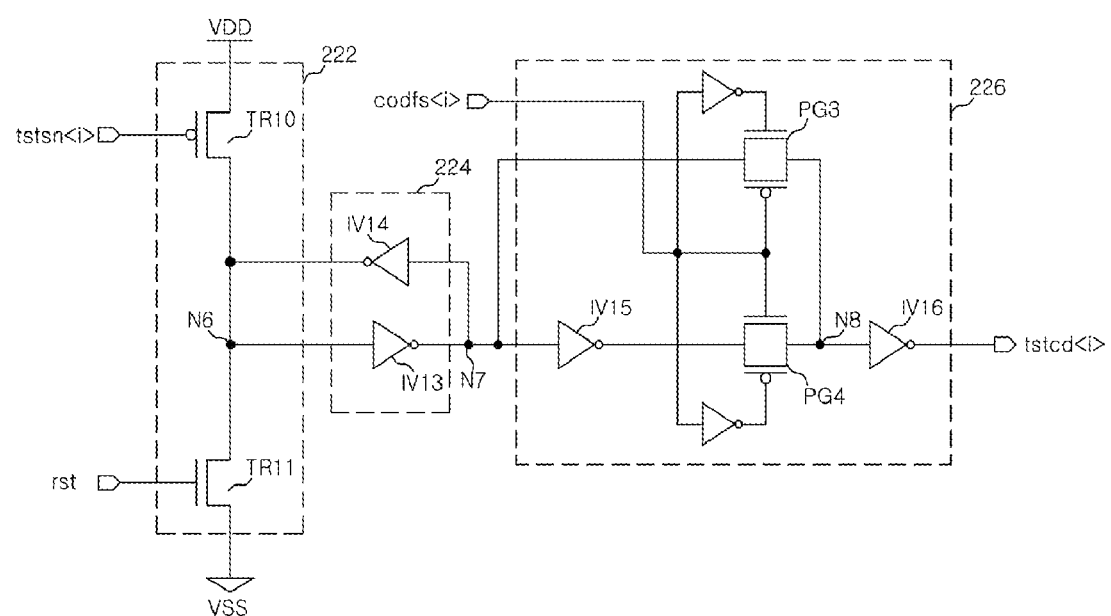
FIG. 5 is a diagram showing the detailed configuration of a test code generating unit that can be included in the apparatus shown in FIG. 1.

FIG. 5 is a diagram showing the detailed configuration of the test code generating unit 220 shown in FIG. 1. As shown in FIG. 5, the test code generating unit 220 can include a fourth potential setter 222 that can be configured to set a voltage on a sixth node N6 in response to the reset signal 'rst' and the test signal 'tstsn<i>', a second latch 224 that can be configured to latch and invert the voltage on the sixth node N6, and transmit the latched and inverted voltage to a seventh node N7, and a second switch 226 that can be configured to control a path of the voltage on the seventh node N7 in response to the coding fuse signal 'codfs<i>' to generate the test code 'tstcd<i>'.

The fourth potential setter 222 can include a tenth transistor TR10 that has a gate, to which the test signal 'tstsn<i>' is input, a source, to which the external power VDD is applied, and a drain connected to the sixth node N6, and an eleventh transistor TR11 that has a gate, to which the reset signal 'rst' is input, a drain connected to the sixth node N6, and a source connected to the ground terminal.

The second latch 224 can include a thirteenth inverter IV13 that can be configured to invert the voltage on the sixth node N6 and output the inverted voltage to the seventh node N7, and a fourteenth inverter IV14 that can be configured to invert the voltage on the seventh node N7 and output the inverted voltage to the sixth node N6.

The second switch 226 can be configured to include a third pass gate PG3 that can be configured to transmit the voltage on the seventh node N7 to an eighth node N8 in response to the coding fuse signal 'codfs<i>', a fifteenth inverter IV15 that can be configured to receive the voltage on the seventh node N7, a fourth pass gate PG4 that can be configured to transmit an output signal of the fifteenth inverter IV15 to the eighth node N8 in response to the coding fuse signal 'codfs<i>', and a sixteenth inverter IV16 that can be configured to receive the voltage on the eighth node N8 and output the test code 'tstcd<i>'.

If the test mode setting apparatus can be configured to start operating when the pulsed reset signal 'rst' is enabled. Accordingly, the voltage level on the sixth node N6 is at a low level. At this time, if the voltage level of the coding fuse signal 'codfs<i>' is at a low level, then the third pass gate PG3 is turned on, and the fourth pass gate PG4 is turned off. Therefore, the voltage level of the test code 'tstcd<i>' is at a low level.

Meanwhile, if the voltage level of the coding fuse signal 'codfs<i>' is at a high level, the fourth pass gate PG4 is turned on, and the third pass gate PG3 is turned off. Therefore, the voltage level of the test code 'tstcd<i>' is at the high level.

That is, if the coding control signal 'cdcnt' that is output from the test mode control block 10 is enabled, then the coding fuse signal 'codfs<i>' is at a low level regardless of whether or not the coding fuse CDFS<i> is cut. Accordingly, the voltage level of the test code 'tstcd<i>' is at a low level. Here, since the (n) coding fuse circuit units 210 and the (n) test code generating unit 220 are provided, the bits of the n-bit test code 'tstcd<1:n>' are all at a low level. As such, if the default values of the n-bit test code 'tstcd<1:n>' are all at a low level, then the test mode setting apparatus 11 has no effect on the test operation of the semiconductor integrated circuit.

Meanwhile, if the coding control signal 'cdcnt' is disabled, then the voltage level of the coding fuse signal 'codfs<i>' is determined according to whether or not the coding fuse CDFS<i> is cut. Therefore, the voltage level of the test code 'tstcd<i>' is also determined according to whether or not the coding fuse CDFS<i> is cut.

The default values of the n-bit test code 'tstcd<1:n>' are generated by the above-described configuration. Subsequently, the logical values of the n-bit test code 'tstcd<1:n>' can be changed using the values of the n-bit test signal 'tstsn<1:n>'.

As described above, a test mode setting apparatus in a semiconductor integrated circuit configured in accordance with the embodiments described herein can include a control fuse, generate a coding control signal whether or not the control fuse is cut, and control the operations of the individual test code generating units. Thus, according to the needs of a particular implementation, the default values of a test code can be generated according to whether or not the control fuse is cut, or a test code having the insignificant same default values can be generated. Therefore, even if the test mode setting apparatus is provided in various semiconductor integrated circuits, a tester can selectively use the test mode setting apparatus, thereby improving adaptability of the test mode setting apparatus to various environments. As a result, during design, time and costs for developing and producing a semiconductor integrated circuit can be reduced.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. An apparatus for setting a test mode in a semiconductor integrated circuit, the apparatus comprising:
a test mode control block that generates a coding control signal according to whether or not a control fuse is cut; and
a test mode coding block that sets default values of a multi-bit test code in response to the coding control signal.

2. The apparatus of claim 1, wherein the test mode control block disables the coding control signal when the control fuse is not cut, and enables the coding control signal when the control fuse is cut.

3. The apparatus of claim 2, wherein, when the coding control signal is enabled, and if a mode setting signal is enabled, the test mode control block disables the coding control signal.

4. The apparatus of claim 1, wherein the test mode control block includes:
a control fuse circuit unit that generates a control fuse signal in response to a power-up signal according to whether or not the control fuse is cut; and
a control signal generating unit that generates the coding control signal in response to the control fuse signal and the power-up signal.

5. The apparatus of claim 4, wherein the control fuse circuit unit includes:
a potential setter that sets a potential on a first node in response to the power-up signal;
a potential controller that controls the potential on the first node and transmits the controlled potential to a second node; and
a driver that drives the potential on the second node to generate the control fuse signal.

6. The apparatus of claim 4, wherein the control signal generating unit includes:
a potential setter that sets a potential on a first node in response to the power-up signal;
a latch that latches and controls the potential on the first node, and transmits the latched and controlled potential to a second node; and
a switch that controls a path of the potential on the second node in response to the control fuse signal to generate the coding control signal.

7. The apparatus of claim 1, wherein the test mode coding block sets the default values of the multi-bit test code to a first level when the coding control signal is enabled, and, when the coding control signal is disabled, sets the default values of the multi-bit test code according to whether or not a plurality of coding fuses are cut.

8. The apparatus of claim 7, wherein the test mode coding block changes the values of the multi-bit test code, which are set to the default values, in response to a multi-bit test signal.

9. The apparatus of claim 8, wherein the test mode coding block includes:
a coding fuse circuit unit that generates a coding fuse signal in response to a power-up signal and the coding control signal according to whether or not the coding fuses are cut; and
a test code generating unit that generates the test code in response to the coding fuse signal, a reset signal, and a test signal.

10. The apparatus of claim 9, wherein the coding fuse circuit unit includes:
a potential setter that sets a potential on a first node in response to the power-up signal;
a potential controller that controls the potential on the first node and transmits the controlled potential to a second node; and
a signal combiner that combines the potential on the second node and the coding control signal, and outputs the coding fuse signal.

11. The apparatus of claim 9, wherein the test code generating unit includes:
a potential setter that sets a potential on a first node in response to the reset signal and the test signal;
a latch that latches and controls the potential on the first node, and transmits the latched and controlled potential to a second node; and
a switch that controls a path of the potential on the second node in response to the coding fuse signal to generate the test code.

12. A method of setting a test mode in a semiconductor integrated circuit, the method comprising:
detecting whether or not a control fuse is cut and generating a coding control signal;
setting default values of a multi-bit test code to a first level when the coding control signal is enabled; and
setting the default values of the multi-bit test code according to whether or not a plurality of coding fuses are cut, when the coding control signal is enabled.

13. The method of claim 12, wherein the generating of the coding control signal includes:
generating a control fuse signal at the first level in response to a power-up signal, when it is detected that the control fuse is cut;
generating a control fuse signal at a second level in response to the power-up signal, when it is detected that the control fuse is not cut; and
generating the coding control signal in response to the control fuse signal.

14. The method of claim 12, wherein the setting of the default values of the multi-bit test code to the first level includes:
generating a plurality of coding fuse signals at the first level in response to the coding control signal; and
generating the multi-bit test code at the first level in response to the plurality of coding fuse signals.

15. The method of claim 12, wherein the setting of the default values of the multi-bit test code according to whether or not the plurality of coding fuses are cut includes:
generating a plurality of coding fuse signals at levels, which correspond to whether or not the plurality of coding fuses are cut, in response to a power-up signal and the coding control signal; and
generating the multi-bit test code at levels corresponding to the plurality of coding fuse signals.

* * * * *